United States Patent
Park

(10) Patent No.: US 10,586,748 B2
(45) Date of Patent: Mar. 10, 2020

(54) PRINTED CIRCUIT BOARD AND SEMICONDUCTOR PACKAGE

(71) Applicant: SAMSUNG ELECTRONICS CO., LTD., Suwon-si, Gyeonggi-do (KR)

(72) Inventor: Soo-Jae Park, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 60 days.

(21) Appl. No.: 15/402,876

(22) Filed: Jan. 10, 2017

(65) Prior Publication Data

US 2017/0309559 A1    Oct. 26, 2017

(30) Foreign Application Priority Data

Apr. 22, 2016   (KR) .................. 10-2016-0049384

(51) Int. Cl.
*H01L 23/498* (2006.01)
*H01L 21/48* (2006.01)
(Continued)

(52) U.S. Cl.
CPC ...... *H01L 23/3121* (2013.01); *H01L 21/4857* (2013.01); *H01L 21/6835* (2013.01);
(Continued)

(58) Field of Classification Search
CPC ........... H01L 23/49838; H01L 21/4857; H01L 23/49866; H01L 24/48; H01L 23/49822; H01L 21/486; H01L 21/6835; H01L 23/3121; H01L 23/49827; H01L 2224/45147; H01L 2924/04941; H01L 2924/01078; H01L 2924/01029;
(Continued)

(56) References Cited

U.S. PATENT DOCUMENTS 6,329,074 B1   12/2001   Fujiwara et al.
6,770,976 B2   8/2004    Wang et al.
(Continued)

FOREIGN PATENT DOCUMENTS

JP   09-092649     4/1997
JP   2014-193606   10/2014
(Continued)

OTHER PUBLICATIONS

Tech Brief, "Room Temperature, Non-Toxic Aluminum Electrodeposition," Technology Readiness Level 3, Analytical and Experimental Critical Function and/or Characteristic Proof of Concept, 2009.

*Primary Examiner* — Steven H Loke
*Assistant Examiner* — Juanita B Rhodes
(74) *Attorney, Agent, or Firm* — F. Chau & Associates, LLC

(57) ABSTRACT

A printed circuit board (PCB) includes an insulating layer with an upper surface and a lower surface opposite to the upper surface; a first conductive pattern on the upper surface of the insulating layer; a second conductive pattern on the lower surface of the insulating layer; an aluminum pattern that covers at least a portion of an upper surface of the first conductive pattern; and a first passivation layer that covers at least a portion of sides of the first conductive pattern and that prevents diffusion into the first conductive pattern.

5 Claims, 12 Drawing Sheets

(51) Int. Cl.
   *H01L 23/31* (2006.01)
   *H01L 23/00* (2006.01)
   *H01L 21/683* (2006.01)

(52) U.S. Cl.
   CPC .. *H01L 23/49822* (2013.01); *H01L 23/49827* (2013.01); *H01L 24/48* (2013.01); H01L 24/45 (2013.01); H01L 2221/68345 (2013.01); H01L 2221/68359 (2013.01); H01L 2221/68381 (2013.01); H01L 2224/32225 (2013.01); H01L 2224/45144 (2013.01); H01L 2224/45147 (2013.01); H01L 2224/48091 (2013.01); H01L 2224/48106 (2013.01); H01L 2224/48227 (2013.01); H01L 2224/48228 (2013.01); H01L 2224/48229 (2013.01); H01L 2224/48235 (2013.01); H01L 2224/73265 (2013.01); H01L 2224/85395 (2013.01); H01L 2224/85424 (2013.01); H01L 2924/01013 (2013.01); H01L 2924/01022 (2013.01); H01L 2924/01028 (2013.01); H01L 2924/01029 (2013.01); H01L 2924/01047 (2013.01); H01L 2924/01073 (2013.01); H01L 2924/01074 (2013.01); H01L 2924/01078 (2013.01); H01L 2924/01079 (2013.01); H01L 2924/04941 (2013.01); H01L 2924/04953 (2013.01); H01L 2924/05432 (2013.01); H01L 2924/1443 (2013.01); H01L 2924/1579 (2013.01); H01L 2924/15724 (2013.01); H01L 2924/181 (2013.01); H01L 2924/403 (2013.01); H01L 2924/40252 (2013.01); H01L 2924/40404 (2013.01)

(58) Field of Classification Search
   CPC . H01L 2924/01028; H01L 2924/01074; H01L 2924/40404; H01L 2924/15724; H01L 2221/68345; H01L 2924/05432; H01L 2224/48235; H01L 2924/01013; H01L 2924/1579; H01L 2224/45144; H01L 2224/48106; H01L 2224/73265; H01L 2224/48091; H01L 2924/01047; H01L 2221/68359; H01L 2924/01022; H01L 2924/403; H01L 2924/40252; H01L 2924/01079; H01L 2221/68381; H01L 2924/01073; H01L 2224/48229; H01L 2924/1443; H01L 2924/04953; H01L 2224/32225; H01L 2224/85395; H01L 2224/48228; H01L 2224/85424; H01L 24/45; H01L 2224/48227; H01L 2924/00014

See application file for complete search history.

(56) References Cited

U.S. PATENT DOCUMENTS

| | | | |
|---|---|---|---|
| 6,955,740 | B2 | 10/2005 | Rapuano et al. |
| 7,027,145 | B2 | 4/2006 | Segall et al. |
| 7,175,920 | B2 | 2/2007 | Suzuki et al. |
| 7,691,487 | B2 | 4/2010 | Nagatani |
| 8,294,039 | B2 | 10/2012 | Yang et al. |
| 8,409,726 | B2 | 4/2013 | Shim et al. |
| 8,461,036 | B2 | 6/2013 | Wu et al. |
| 8,729,395 | B2 | 5/2014 | Lee |
| 2004/0126547 | A1* | 7/2004 | Coomer ............ H01L 21/4857 428/209 |
| 2005/0017361 | A1* | 1/2005 | Lin .................... H01L 23/5222 257/756 |
| 2007/0205520 | A1* | 9/2007 | Chou ................. H01L 23/3157 257/780 |
| 2008/0217758 | A1* | 9/2008 | Liao ....................... H05K 3/242 257/692 |
| 2010/0071950 | A1* | 3/2010 | Ohsumi ............ H01L 23/49811 174/261 |
| 2011/0031596 | A1 | 2/2011 | Gruenhagen et al. |
| 2011/0089462 | A1 | 4/2011 | Van Heerden et al. |
| 2011/0297423 | A1* | 12/2011 | Noh ..................... H05K 3/4007 174/250 |
| 2012/0175772 | A1 | 7/2012 | Leung et al. |
| 2013/0192885 | A1* | 8/2013 | Lee ..................... H05K 3/0058 174/258 |
| 2013/0277838 | A1 | 10/2013 | Yu et al. |
| 2013/0320547 | A1 | 12/2013 | Zhang et al. |
| 2014/0144682 | A1 | 5/2014 | Orlowski et al. |
| 2014/0231127 | A1 | 8/2014 | Manero |
| 2014/0264827 | A1* | 9/2014 | Prakash ................. C08K 5/005 257/737 |
| 2014/0308538 | A1 | 10/2014 | Chen |
| 2015/0340332 | A1* | 11/2015 | Rinne ..................... H01L 24/13 257/737 |
| 2016/0329275 | A1 | 11/2016 | Park et al. |
| 2016/0374205 | A1* | 12/2016 | Moriyama ............... H05K 1/09 |

FOREIGN PATENT DOCUMENTS

| | | |
|---|---|---|
| JP | 5826322 | 10/2015 |
| KR | 10-0959164 | 5/2010 |
| KR | 10-1317184 | 10/2013 |
| KR | 10-1391811 | 5/2014 |
| KR | 10-2014-0076811 | 6/2014 |

\* cited by examiner

PRINTED CIRCUIT BOARD AND SEMICONDUCTOR PACKAGE

CROSS-REFERENCE TO RELATED APPLICATION

This application claims priority under 35 USC § 119 from, and the benefit of, Korean Patent Application No. 10-2016-0049384, filed on Apr. 22, 2016 in the Korean Intellectual Property Office, the contents of Which are herein incorporated by reference in their entirety.

BACKGROUND

Embodiments of the inventive concept are directed to a printed circuit board (PCB) and a semiconductor package, and more particularly, to a PCB that has a surface treatment performed on pads thereof using aluminum and a semiconductor package.

As electronic components have become large-scale, various surface treatment technologies of a printed circuit board (PCB) have been developed. A metal plating technology is used to treat a surface of a PCB. In addition, due to consumer demand, electronic systems now have high-performance functions and smaller sizes, which leads to an increase in the number of connection terminals connected to a PCB included in an electronic system and a reduction in intervals and sizes of the connection terminals. A total area of the PCB can be reduced by reducing the intervals and sizes of the connection terminals. Accordingly, processes, such as tenting, a semi additive process (SAP), and a modified semi-additive process (MSAP), have been studied.

SUMMARY

Embodiments of the inventive concept can provide a printed circuit board (PCB) that reduces process costs and improves bonding process reliability.

Embodiments of the inventive concept can also provide a semiconductor package that reduces process costs and improves bonding process reliability.

According to an embodiment of the inventive concept, there is provided a printed circuit board (PCB) that includes an insulating layer that includes an upper surface and a lower surface opposite to the upper surface; a first conductive pattern on the upper surface of the insulating layer; a second conductive pattern on the lower surface of the insulating layer; an aluminum pattern that covers at least a portion of an upper surface of the first conductive pattern; and a first passivation layer that covers at least a portion of sides of the first conductive pattern and that prevents diffusion into the first conductive pattern.

According to another embodiment of the inventive concept, there is provided a semiconductor package that includes a package substrate; a semiconductor chip on the package substrate; and a bonding wire that connects the package substrate and the semiconductor chip, wherein the package substrate includes: an insulating layer; a first wiring pattern on an upper surface of the insulating layer and that includes copper; a second wiring pattern on the first wiring pattern and that includes a material different from that of the first wiring pattern; and an organic passivation layer on sides of the first wiring pattern that prevents diffusion into the first wiring pattern.

According to another embodiment of the inventive concept, there is provided a method for manufacturing a printed circuit board (PCB) that includes providing a carrier substrate that includes a carrier layer, a release layer, and an aluminum layer; forming a first conductive layer on the carrier substrate; forming a insulating layer and a second conductive layer on the first conductive layer; forming contact plugs that penetrate into the insulating layer and that electrically connect the first conductive layer and the second conductive layer; separating the carrier layer and the aluminum layer from each other by separating the release layer into two sublayers, wherein a first sublayer remains with the carrier layer and a second sublayer remains with the aluminum layer; removing the separated carrier layer and the first sublayer of the release layer; forming an aluminum pattern, a first conductive pattern, and a second conductive pattern by respectively patterning the aluminum layer the first conductive layer, and the second conductive layer, and removing the second sublayer of the release layer from the aluminum layer; forming a first solder resist layer and a second solder resist layer respectively on an upper surface of the insulating layer and a lower surface of the insulating layer opposite to the upper surface, wherein the first solder resist layer includes at least one opening that exposes a part of the first conductive pattern and a part of the aluminum pattern; and forming a first passivation layer and a second passivation layer on respective exposed surfaces of the first conductive pattern and the second conductive pattern by an organic solderability preservative (OSP) surface treatment.

BRIEF DESCRIPTION OP THE DRAWINGS

FIGS. 6A through D are cross-sectional views that illustrate a method of manufacturing a PCB according to embodiments.

Figure 7:
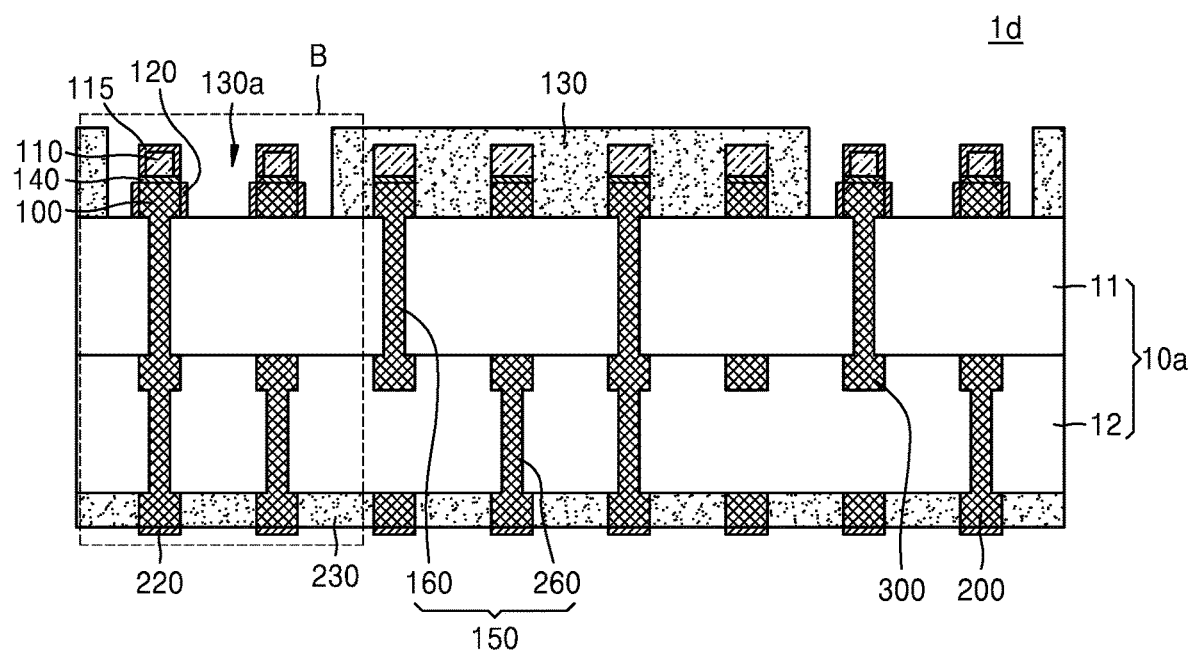

FIG. 7 is a cross-sectional view of a PCB according to embodiments.

Figure 8:
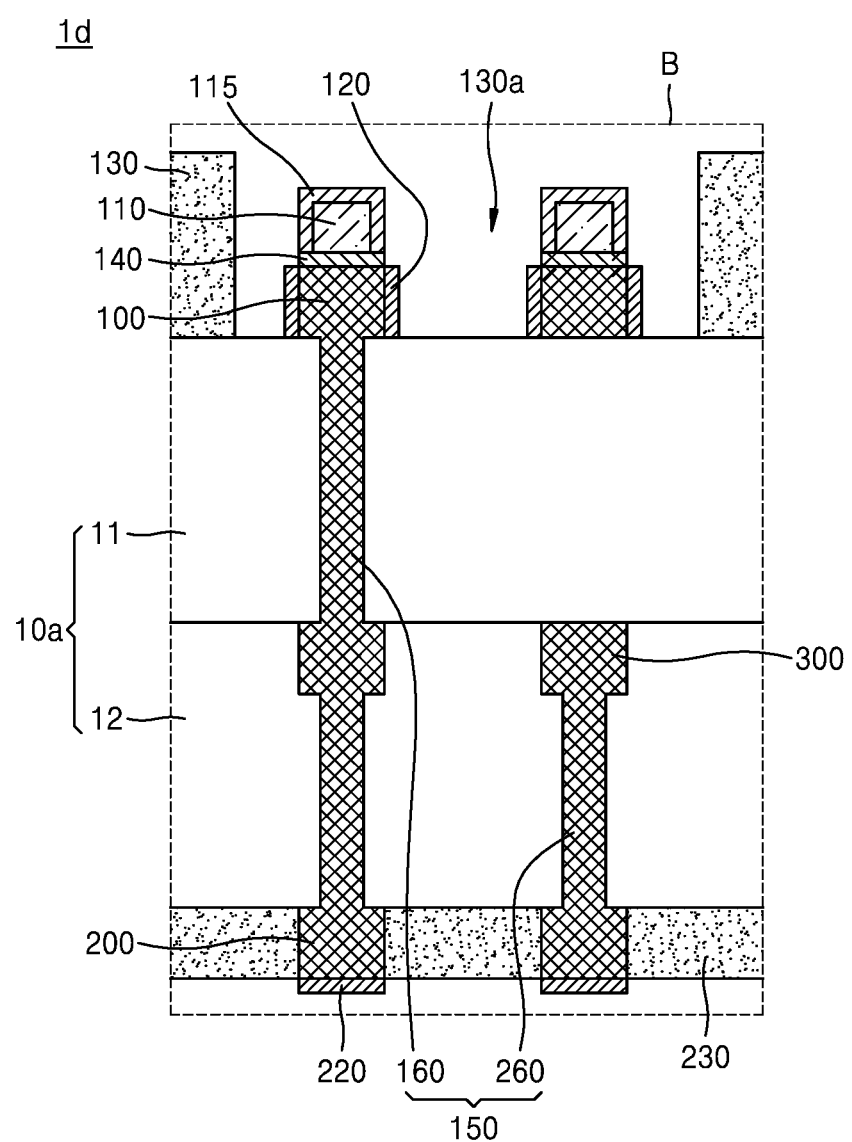

FIG. 8 is an enlarged cross-sectional view of a part B of FIG. 7 according to embodiments.

FIGS. 9A through 9D are cross-sectional views that illustrate a method of manufacturing a PCB according to embodiments.

Figure 10:
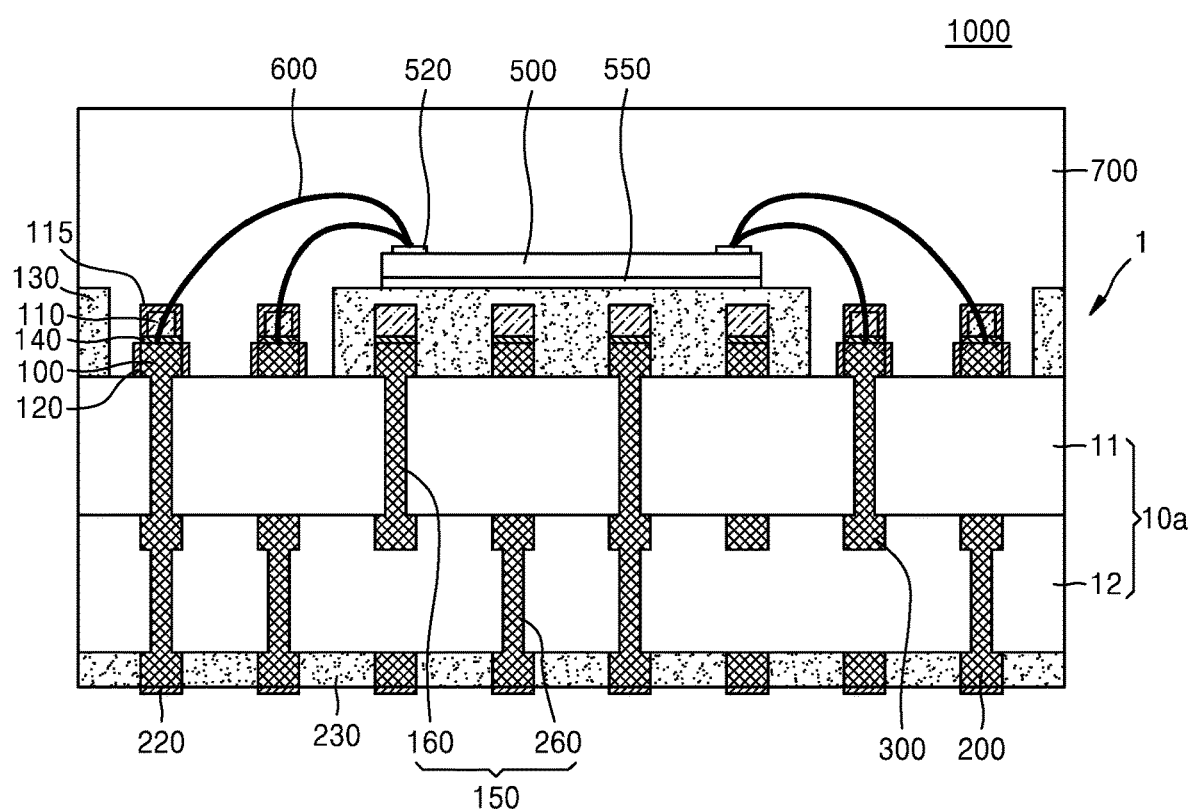

FIG. 10 is a cross-sectional view of a semiconductor package in which a PCB is used according to embodiments.

DETAILED DESCRIPTION OF THE EMBODIMENTS

Figure 1:
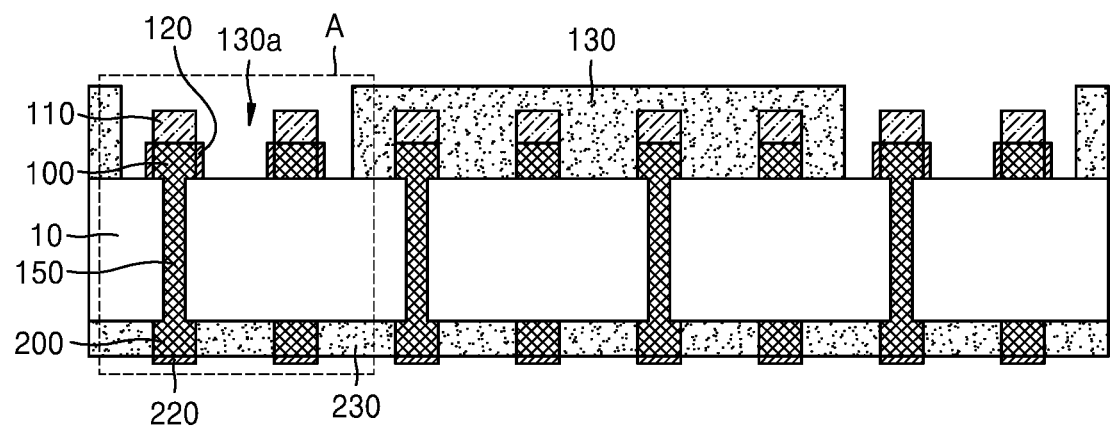
FIG. 1 is a cross-sectional view of a printed circuit board (PCB) according to embodiments.
Figure 2:
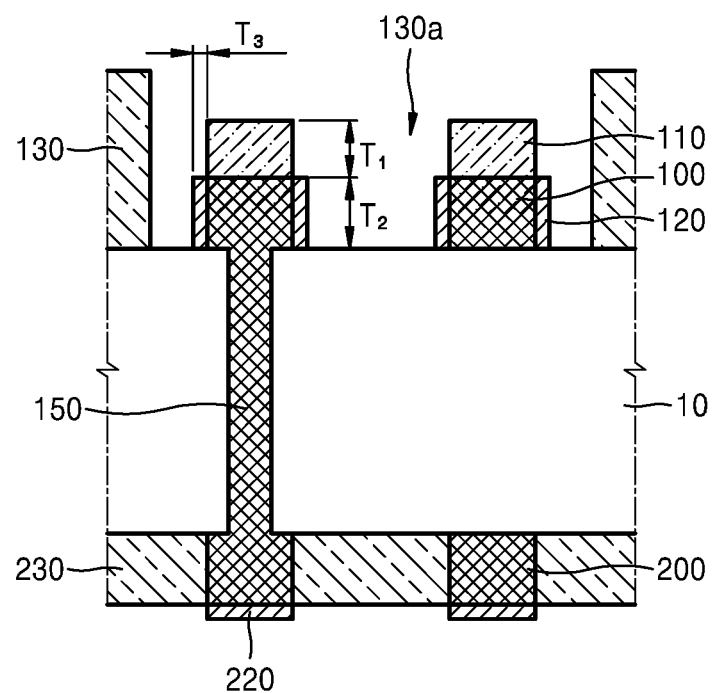
FIG. 2 is an enlarged cross-sectional view of a part A of FIG. 1, according to embodiments.

FIG. 1 is a cross-sectional view of a printed circuit board (PCB) 1a according to embodiments. FIG. 2 is an enlarged cross-sectional view of a part A of FIG. 1 according to embodiments.

Referring to FIGS. 1 and 2, the PCB 1a according to an embodiment includes an insulating layer 10 with an upper surface and a lower surface opposite to the upper surface, a first conductive pattern 100, a second conductive pattern 200, an aluminum pattern 110, a first passivation layer 120, a second passivation layer 220, a first solder resist layer 130, and a second solder resist layer 230.

According to an embodiment, the insulating layer 10 includes at least one material selected from phenol resin, epoxy resin, and polyimide. For example, the insulating layer 10 may include at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer. In some embodiments, the insulating layer 10 includes, for example, polyester (PET), polyester telephthalate, fluorinated ethylene propylene (FEP), resin-coated paper, liquid polyimide resin, a polyethylene naphthalate (PEN) film, etc.

According to an embodiment, the first conductive pattern 100 is formed on the upper surface of the insulating layer 10. The second conductive pattern 200 is formed on the lower surface of the insulating layer 10. To electrically connect the first conductive pattern 100 and the second conductive pattern 200, a contact plug 150 that penetrates into the insulating layer 10 is formed. A plurality of first patterns 100 and a plurality of second patterns 200 can be configured. Accordingly, a plurality of contact plugs 150 can also be formed. The first conductive pattern 100 may include at least one of copper (Cu), nickel (Ni), aluminum (Al), gold (Au), platinum (Pt), and silver (Ag). For example, the first conductive pattern 100 may include copper. The second conductive pattern 200 may include a material similar to the material of the first conductive pattern 100, but embodiments are not limited thereto. The second conductive pattern 200 may include a material different from the material of the first conductive pattern 100.

According to an embodiment, the aluminum pattern 110 is formed to cover at least a part of an upper surface of the first conductive pattern 100. The aluminum pattern 110 can prevent the first conductive pattern 100 from being exposed. In this regard, the upper surface of the first conductive pattern 100 is higher than an upper surface of the insulating layer 10. Thus, the aluminum pattern 110 has a shape that protrudes from the insulating layer 10. A plurality of aluminum patterns 110 may also be configured, like the first conductive pattern 100. Aluminum has good electrical conductivity and a low price, and thus can replace gold, silver, etc. that are conventionally used to treat surfaces of pads formed on a substrate. As a result, manufacturing costs of the PCB 1a can be reduced.

According to an embodiment, a thickness T1 of the aluminum pattern 110 in a direction perpendicular to the upper surface of the insulating layer 10 is less than a thickness T2 of the first conductive pattern 100 in a direction perpendicular to the upper surface of the insulating layer 10. That is, a thin aluminum pattern 110 can be formed on the upper surface of the first conductive pattern 100. However, the thickness T1 of the aluminum pattern 110 is relatively exaggerated for emphasis in FIGS. 1 and 2. The thickness T1 of the aluminum pattern 110 may be from about 0.1 µm to about 1 µm. The thickness T2 of the first conductive pattern 100 may be from about 0.1 µm to greater than 10 µm.

According to an embodiment, the first passivation layer 120 covers at least a part of the sides of the first conductive pattern 100. The first passivation layer 120 can prevent diffusion into the first conductive pattern 100. The first passivation layer 120 includes a material formed through an organic solderability preservative (OSP) surface treatment. For example, when the first conductive pattern 100 includes copper, the first passivation layer 120 may include an organic compound such as benzotriazole, imidazole, benzimidazole, etc., that can attach to a copper surface and chemically combine with copper atoms. In particular, when the first conductive pattern 100 includes copper, the first passivation layer 120 on which the OSP surface treatment is performed can prevent an unwanted oxidation reaction from occurring in a surface of the first conductive pattern 100 or prevent the surface from being damaged.

According to an embodiment, the first passivation layer 120 is relatively thin 120 on the sides of the first conductive pattern 100. A thickness T3 of the first passivation layer 120 on the sides of the first conductive pattern 100 is equal to or less than 0.5 µm. Thus, spaces between the first conductive patterns 100 increase in size, and process reliability increases during wire bonding of the PCB 1a.

According to an embodiment, the first solder resist layer 130 is formed on the insulating layer 10 and includes an opening 130a. An upper surface of a portion of the aluminum pattern 110 is exposed by the opening 130a of the first solder resist layer 130. The second solder resist layer 230 is formed on a lower surface of the insulating layer 10. In this regard, the second solder resist layer 230 is formed to cover sides of the second conductive pattern 200. The first solder resist layer 130 and the second solder resist layer 230 are insulating layers and may include a polyimide film, a polyester film, a flexible solder mask, a photoimageable coverlay (PIC), a photoimageable solder resist, etc. The first solder resist layer 130 can protect the first conductive pattern 100 and can prevent a bridge phenomenon from occurring between adjacent second conductive patterns 200.

According to an embodiment, the second passivation layer 220 is additionally formed in a lower surface of the second conductive pattern 200 that does not contact the second solder resist layer 230. The second passivation layer 220 covers at least a portion of the lower surface of the second conductive pattern 200. The second passivation layer 220 includes the same material as the first passivation layer 120 through the same process and can perform the same function as the first passivation layer 120.

According to an embodiment, the PCB 1a described above has a surface treatment performed on pads thereof using aluminum, thereby reducing process costs. The PCB 1a also has larger spaces between pads formed thereon, thereby increasing reliability of an electrical connection and increasing reliability of a bonding process.

FIGS. 3A through 3H are cross-sectional views that illustrate a method of manufacturing a PCB according to embodiments.

Figure 3A:
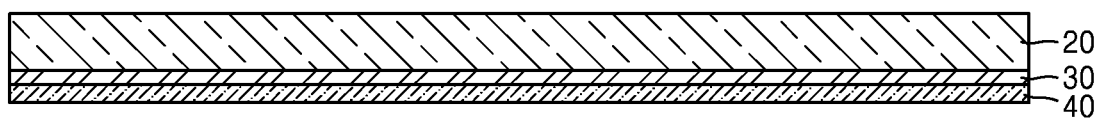
FIGS. 3A through 3H are cross-sectional views that illustrate a method of manufacturing a PCB according to embodiments.

According to an embodiment, referring to FIG. 3A, a carrier substrate 2a is provided that includes a carrier layer 20, a release layer 30, and an alumininum layer 40. The carrier layer 20 has a stack structure comprising a plurality of insulating layers, such as resin, glass fiber, etc. The carrier layer 20 can support other layers during a subsequent process that will be described below.

According to an embodiment, the release layer 30 includes an alloy and an organic compound. The release layer 30 can also include an adhesive layer and may be formed as a non-conductive film (NCF), an anisotropic conductive film (ACF), an instant adhesive, a thermosetting adhesive, a laser curable adhesive, an ultrasound curable adhesive, etc. The adhesive layer may be formed by, for example, spin coating, painting, spraying, etc.

The aluminum layer 40 may be formed through chemical deposition, metal sputtering, electroplating and electroless metal plating processes. The release layer 30 and the aluminum layer 40 are shown as being formed on one surface of the carrier layer 20 in FIG. 3, but embodiments are not limited thereto. In other embodiments, another release layer and another aluminum layer may be also formed on a surface opposite to the surface on which the release layer 30 and the aluminum layer 40 are formed.

Figure 3B:
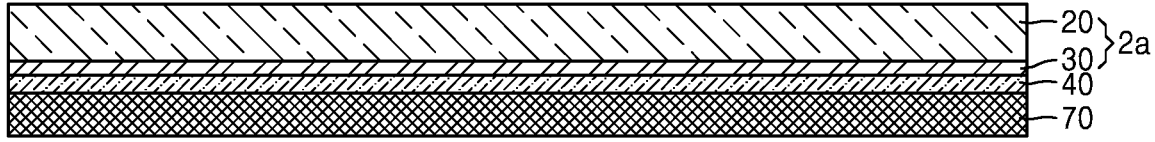

Referring to FIG. 3B, according to an embodiment, a first conductive layer 70 is formed on the carrier substrate 2a. For example, a seed layer may be formed on the aluminum layer 40 of the carrier substrate 2a, and the first conductive layer 70 may be formed by plating by using the seed layer as a seed. The first conductive layer 70 may be formed by immersion plating, electroless plating, electroplating, or a combination of these. Thus, when the seed layer includes copper, the first conductive layer 70 includes copper. In some embodiments, the first conductive layer 70 applies a current using a plating solution that contains an additive. The additive may be at least one of, for example, a leveler that levels a plating layer, a grain refiner that refines particles of the plating layer, a stress reducer that reduces stress of the plating layer while being plated thereon, or a wetting agent that makes plating atoms adhere well to a surface of a cathode.

Figure 3C:
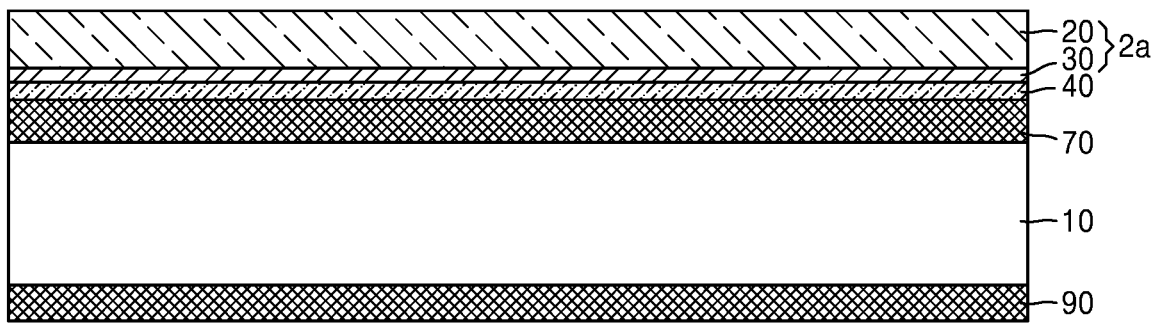

Referring to FIG. 3C, according to an embodiment, the insulating layer 10 and a second conductive layer 90 are formed on the first conductive layer 70. A material used to form the insulating layer 10 was described above with reference to FIG. 1. The insulating layer 10 has a stack structure comprising a plurality of layers and includes wirings, which will be described below. The second conductive layer 90 is formed in the same manner as the first conductive layer 70. Thus, the second conductive layer 90 may be formed by plating after forming a seed layer. The first conductive layer 70 and the second conductive layer 90 may include the same material. For example, the first conductive layer 70 and the second conductive layer 90 may include copper.

Figure 3D:
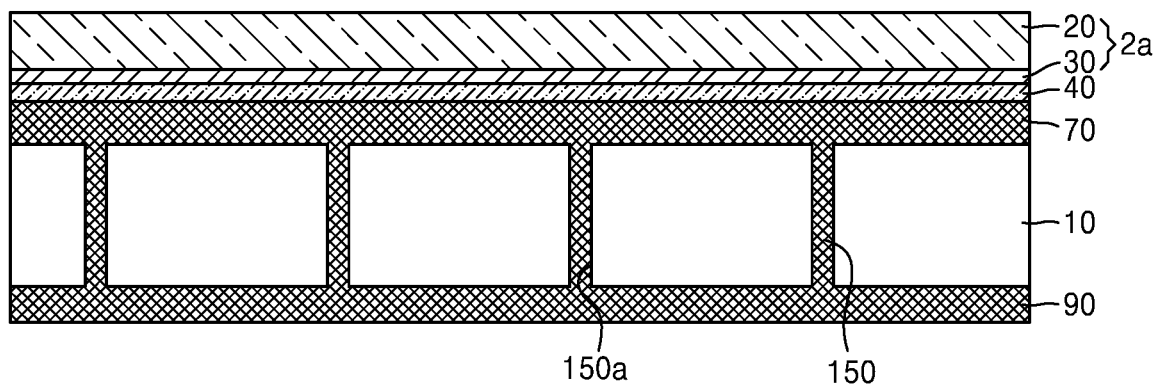

Referring to FIG. 3D, according to an embodiment, the contact plug 150 that penetrates into the insulating layer 10 and electrically connects the first conductive layer 70 and the second conductive layer 90 is formed. The contact plug 150 is formed by forming a contact hole 150a using wet or dry etching or through mechanical drilling or laser drilling and then filling the contact hole 150a using a conductive material through a plating process. Laser drilling may use, for example, a $CO_2$ laser, a yttrium aluminum garnet (YAG) laser, an excimer laser, a Cu-vapor laser, or a hybrid combination of these lasers.

Figure 3E:
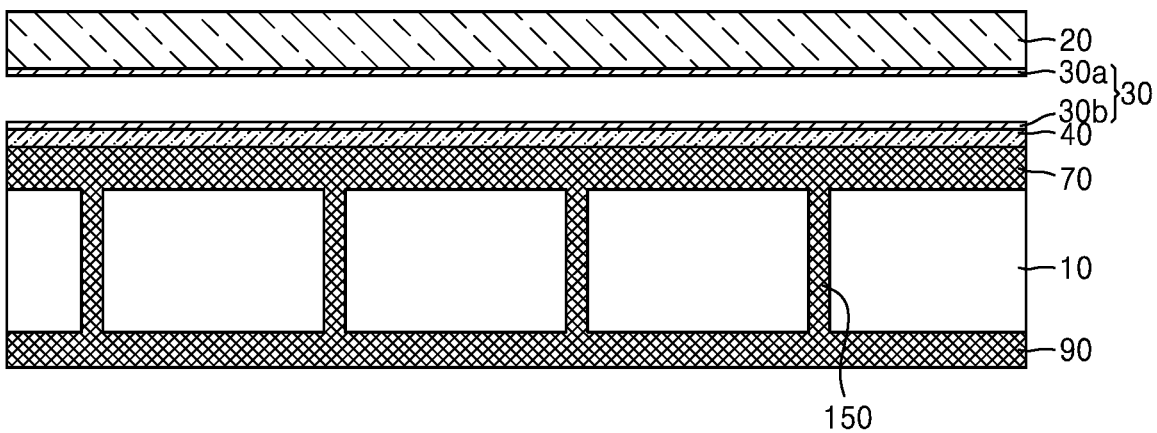

Referring to FIG. 3E, according to an embodiment, the carrier layer 20 and the aluminum layer 40 are separated from each other by separating the release layer 30 into two sublayers. A separation process may be performed by a physical method using a blade, a chemical method using a separation solvent, a laser ablation using a laser, etc. A sublayer 30a of the release layer 30 remains with the carrier layer 20. Another sublayer 30b of the release layer 30 remains with the aluminum layer 40. The separated carrier layer 20 and the sublayer 30a of the release layer 30 are removed.

Figure 3F:
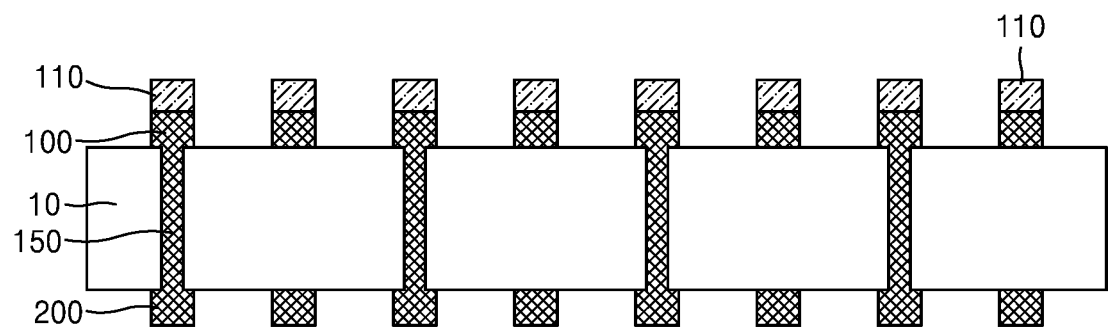

Referring to FIGS. 3E and 3F, according to an embodiment, an aluminum pattern 110, a first conductive pattern 100, and a second conductive pattern 200 are respectively formed by patterning the aluminum layer 40, the first conductive layer 70, and the second conductive layer 90. A mask is used to form the aluminum pattern 110, the first conductive pattern 100, and the second conductive pattern 200 by etching the aluminum layer 40, the first conductive layer 70, and the second conductive layer 90. In this regard, the other sublayer 30b of the release layer 30 is also removed from the aluminum layer 40.

Figure 3G:
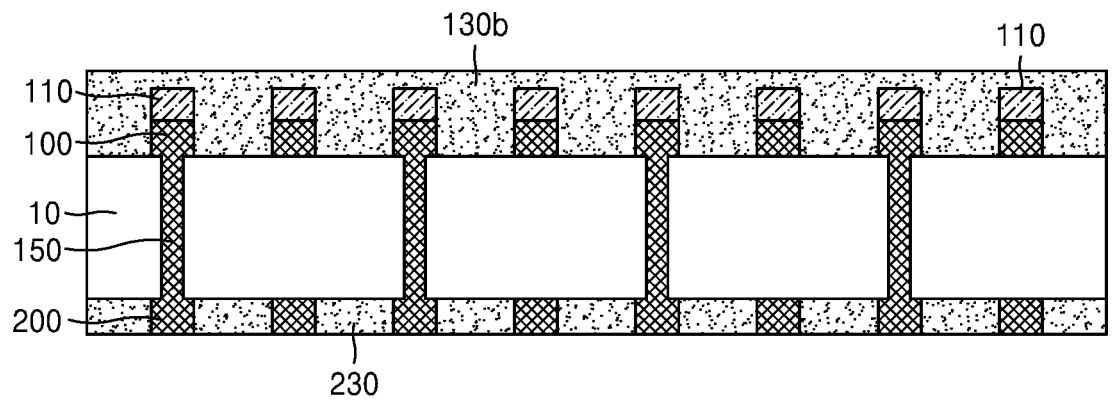

Referring to FIG. 3G, according to an embodiment, a preparatory first solder resist layer 130b is formed on an upper surface of the insulating layer 10, and the second solder resist layer 230 is formed on a lower surface of the insulating layer 10 opposite to the upper surface. The preparatory first solder resist layer 130b covers both upper and side surfaces of the aluminum pattern 110, and sides of the first conductive pattern 100. The second solder resist layer covers sides of the second conductive pattern 200.

The preparatory first solder resist layer 130b and the second solder resist layer 230 may be formed by, for example, directly coating the insulating layer 10 with thermosetting ink using silk screen printing or inkjet printing and thermally hardening the coated thermosetting ink. Alternatively, the preparatory first solder resist layer 130b and the second solder resist layer 230 may be formed by, for example, entirely coating the insulating layer 10 with a photoimageable solder resist using screen printing or spray coating. The preparatory first solder resist layer 130b and the second solder resist layer 230 may be formed by, for example, a laminating method that adheres a polyimide film or a polyester film onto the insulating layer 10. Materials of the first solder resist layer 130 and the second solder resist layer 230 are described with reference to FIG. 1, above.

Figure 3H:
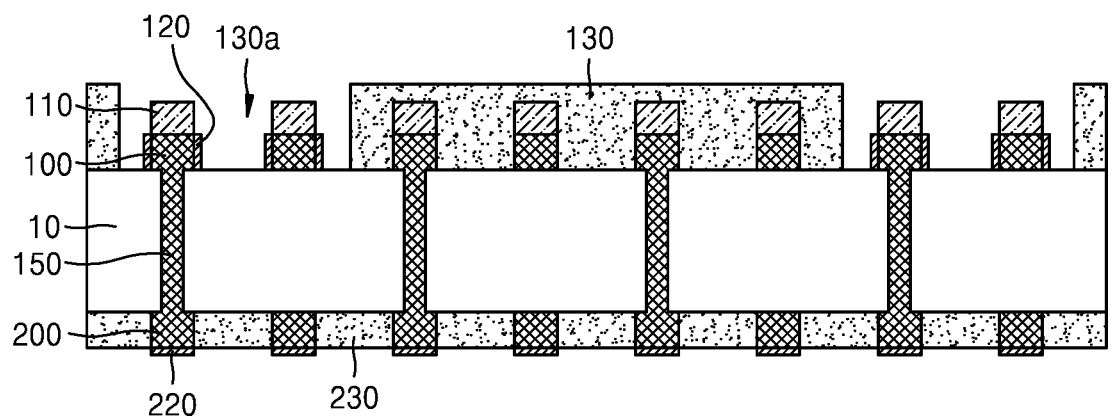

Referring to FIGS. 3G and 3H, according to an embodiment, the first solder resist layer 130, including the opening 130a, is formed by removing a part of the preparatory first solder resist layer 130b. The opening 130a is formed by removing an unnecessary portion using exposure and development. A part of the first conductive pattern 100 and a part of the aluminum pattern 110 are exposed by the opening 130a. The exposed parts of the first conductive pattern 100 and the aluminum pattern 110 can function as pads that contact a bonding wire that electrically connects the PCB and a semiconductor chip or a semiconductor package that is mounted on the PCB.

According to an embodiment, the first passivation layer 120 and the second passivation layer 220 are respectively formed on exposed surfaces of the first conductive pattern 100 and the second conductive pattern 200. Thus, the first passivation layer 120 is formed on sides of portions of the first conductive pattern 100, and the second passivation layer 220 is formed on lower surfaces of at least portions of the second conductive pattern 200. The first passivation layer 120 and the second passivation layer 220 are formed through an OSP surface treatment. The first passivation layer 120 and the second passivation layer 220 may be simultaneously formed, but embodiments are not limited thereto.

Figure 4:
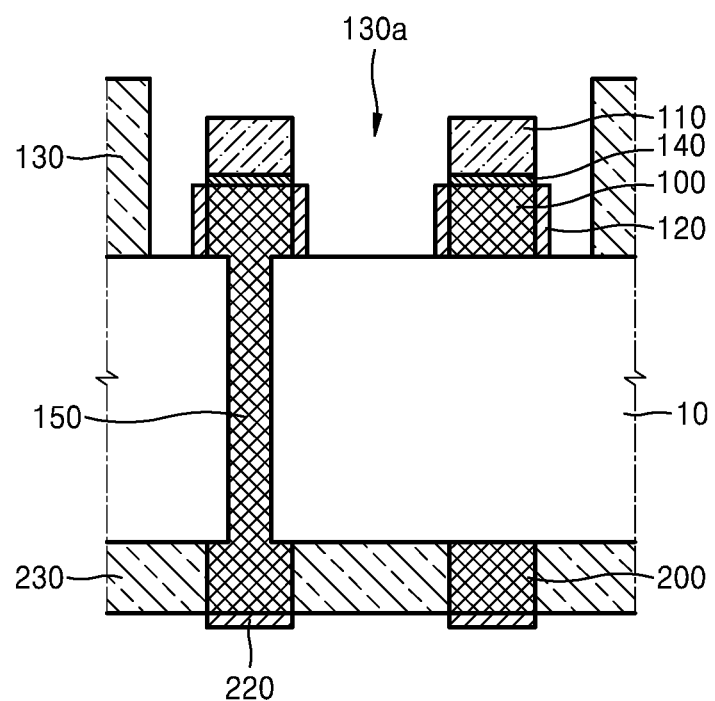
FIG. 4 is an enlarged cross-sectional view of a part of a PCB according to embodiments.

FIG. 4 is an enlarged cross-sectional view of a part of a PCB 1b according to embodiments. The part of the PCB 1b corresponds to a part A of FIG. 1.

Referring to FIG. 4, the PCB 1b according to an embodiment includes the insulating layer 10, the first conductive pattern 100, the second conductive pattern 200, the aluminum pattern 110, the first passivation layer 120, the second passivation layer 220, the first solder resist layer 130, the second solder resist layer 230, and a barrier pattern 140.

According to an embodiment, barrier pattern 140 can prevent a reduction in electrical conductivity due to diffusion of a conductive material from the first conductive pattern 100 to the aluminum pattern 110. The barrier pattern 140 may include, for example, nickel (Ni), titanium (Ti), tantalum (Ta), titanium nitride (TiN), tantalum nitride (TaN), gold (Au), silver (Ag), and tungsten (W). For example, the barrier pattern 140 may be a layer that includes nickel (Ni).

Figure 5:
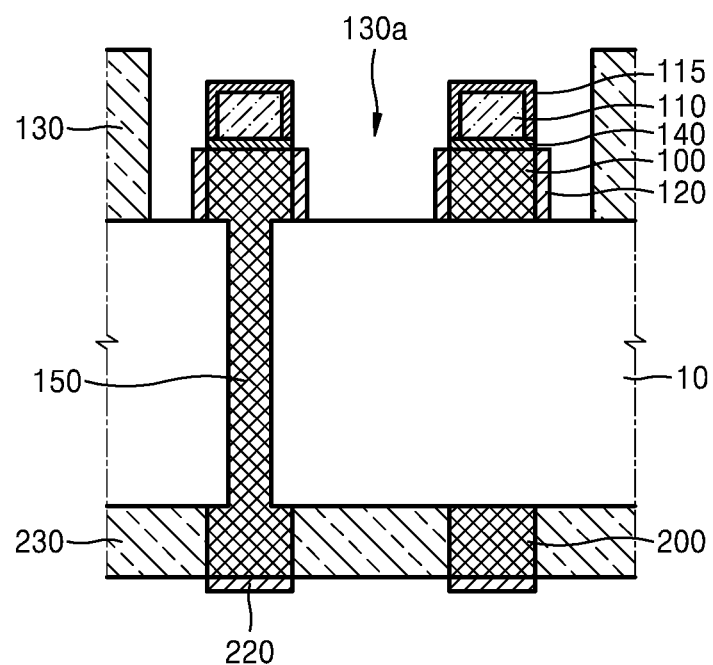
FIG. 5 is an enlarged cross-sectional view of a part of a PCB according to embodiments.

FIG. 5 is an enlarged cross-sectional view of a part of a PCB 1c according to embodiments. The part of the PCB 1c corresponds to a part A of FIG. 1.

Referring to FIG. 5, the PCB 1c according to an embodiment includes the insulating layer 10, the first conductive pattern 100, the second conductive pattern 200, the aluminum pattern 110, the first passivation layer 120, the second passivation layer 220, the first solder resist layer 130, the second solder resist layer 230, the bather pattern 140, and an oxide layer 115. For example, the oxide layer 115 may be alumina ($Al_2O_3$). The oxide layer 115 can prevent additional oxidation and discoloration of the aluminum pattern 110, thereby improving reliability when the aluminum pattern 110 functions as a pad. Naturally oxidized aluminum can efficiently protect internally formed conductive materials without a further process.

FIGS. 6A through 6D are cross-sectional views that illustrate a method of manufacturing a PCB according to embodiments. Redundant descriptions between FIGS. 6A through 6D and FIGS. 3A through 3H are omitted.

Figure 6A:
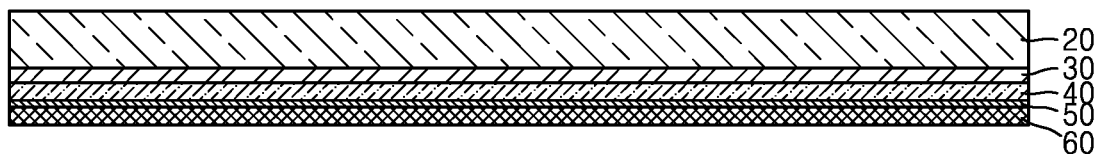

Referring to FIG. 6A, according to an embodiment, a carrier substrate 2b is provided that includes the carrier layer 20, the release layer 30, the aluminum layer 40, a barrier layer 50, and a seed layer 60. The release layer 30, the aluminum layer 40, the barrier layer 50, and the seed layer 60 are shown as being formed on one surface of the carrier layer 20 in FIG. 6, but embodiments are not limited thereto. In other embodiments, another release layer, another aluminum layer, another barrier layer, and another seed layer may be formed on a surface opposite to the surface on which the release layer 30, the aluminum layer 40, the barrier layer 50 and the seed layer 60 are formed. The seed layer 60 is a copper seed layer that includes copper (Cu).

Figure 6B:
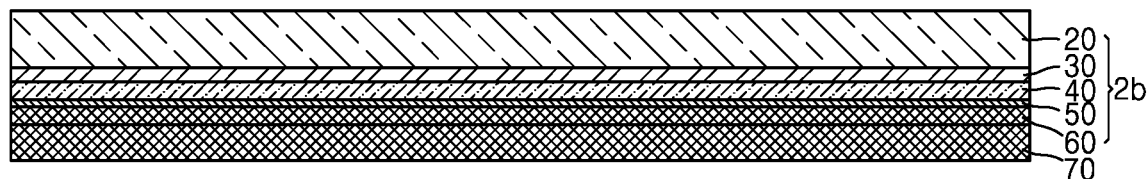

Referring to FIG. 6B, according to an embodiment, the first conductive layer 70 is formed on the carrier substrate 2b, The first conductive layer 70 is formed by plating using the seed layer 60 as a seed. Thus, when the seed layer 60 includes copper, the first conductive layer 70 includes copper.

Figure 6C:
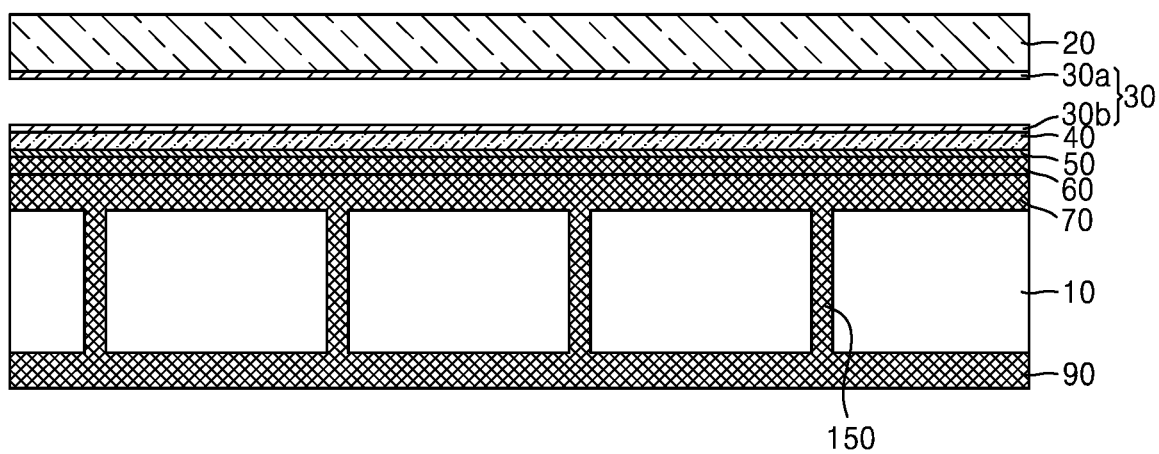

Referring to FIG. 6C, according to an embodiment, the insulating layer 10 and the second conductive layer 90 are formed on the first conductive layer 70, The contact plug 150 that penetrates into the insulating layer 10 and electrically connects the first conductive layer 70 and the second conductive layer 90 is formed. A material used to form the insulating layer 10 was described with reference to FIG. 1, above. In this regard, the first conductive layer 70, the second conductive layer 90, and the contact plug 150 include the same material. For example, the first conductive layer 70, the second conductive layer 90, and the contact plug 150 may include copper. However, the first conductive layer 70, the second conductive layer 90, and the contact plug 150 are not limited thereto and may include different materials in other embodiments.

Referring to FIG. 6C, according to an embodiment, the carrier layer 20 and the aluminum layer 40 are separated from each other by separating the release layer 30 into two sublayers. The sublayer 30a of the release layer 30 remains with the carrier layer 20. The other sublayer 30b of the release layer 30 remains with the aluminum layer 40, The separated carrier layer 20 and the sublayer 30a of the release layer 30 are removed.

Figure 6D:
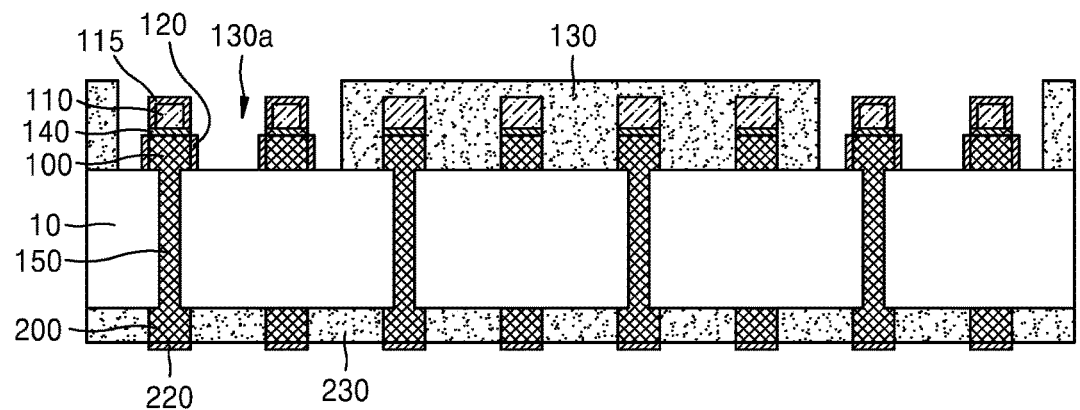

Referring to FIGS. 6C and 6D, according to an embodiment, the aluminum pattern 110, the barrier pattern 140, the first conductive pattern 100, and the second conductive pattern 200 are respectively formed by patterning the aluminum layer 40, the barrier layer 50, the first conductive layer 70, and the second conductive layer 90. A mask is used to form the aluminum pattern 110, the barrier pattern 140, the first conductive pattern 100, and the second conductive pattern 200 by etching the aluminum layer 40, the barrier layer 50, the first conductive layer 70, and the second conductive layer 90. In this regard, the other sublayer 30b of the release layer 30 is removed from the aluminum layer 40.

According to an embodiment, the first solder resist layer 130 and the second solder resist layer 230 are respectively formed on an upper surface of the insulating layer 10 and a lower surface of the insulating layer 10 opposite to the upper surface. The first solder resist layer 130 covers at least a part of upper surface and sides of the aluminum pattern 110, sides of the barrier pattern 140, and sides of the first conductive pattern 100. The second solder resist layer 230 covers sides of the second conductive pattern 200.

According to an embodiment, the first solder resist layer 130 includes at least one opening 130a that exposes a part of the first conductive pattern 100, a part of the barrier pattern 140, and a part of the aluminum pattern 110. The exposed parts of the first conductive pattern 100, the barrier pattern 140, and the aluminum pattern 110 can function as pads that contact a bonding wire that electrically connects the PCB and a semiconductor chip or a semiconductor package that is mounted on the PCB.

According to an embodiment, the first passivation layer 120 and the second passivation layer 220 are respectively formed on exposed surfaces of the first conductive pattern 100 and the second conductive pattern 200. Thus, the first passivation layer 120 is formed on sides of portions of the first conductive pattern 100, and the second passivation layer 220 is formed on lower surfaces of at least portions of the second conductive pattern 200. The first passivation layer 120 and the second passivation layer 220 are formed through an OSP surface treatment.

According to an embodiment, the oxide layer 115 is formed on an exposed surface of the aluminum pattern 110. The oxide layer 115 can naturally form as the aluminum pattern 110 contacts air. Thus, the oxide layer 115 is an aluminum oxide. The oxide layer 115 can protect the aluminum pattern 110.

FIG. 7 is a cross-sectional view of a PCB 1d according to embodiments. FIG. 8 is an enlarged cross-sectional view of a part B of FIG. 7 according to embodiments.

Referring to FIGS. 7 and 8, the PCB 1d according to an embodiment includes an insulating layer 10a, the first conductive pattern 100, the second conductive pattern 200, the aluminum pattern 110, the first passivation layer 120, the second passivation layer 220, the first solder resist layer 130, the second solder resist layer 230, the barrier pattern 140, and the oxide layer 115. In this regard, the insulating layer 10a includes a first insulating layer 11 and a second insulating layer 12. The second insulating layer 12 is formed on a lower portion of the first insulating layer 11. Redundant descriptions between FIGS. 7 and 8 and FIGS. 1, 2, 4, and 5 are omitted below.

According to an embodiment, a third conductive pattern 300 is formed in the second insulating layer 12. Accordingly, a first contact plug 160 is formed that penetrates into the first insulating layer 11 and electrically connects the first conductive pattern 100 and the third conductive pattern 300. A second contact plug 260 is formed that penetrates into the second insulating layer 12 and electrically connects the second conductive pattern 200 and the third conductive pattern 300. The insulating layer 10a may include two layers as shown in FIGS. 7 and 8, but embodiments are not limited thereto. The insulating layer 10a may include an additional layer, and thus the contact plug 150 may be formed in various ways.

According to an embodiment, a thickness of the aluminum pattern 110 in a direction perpendicular to an upper surface of the insulating layer 10a is less than the thickness of the first conductive pattern 100 in the direction perpendicular to the upper surface of the insulating layer 10a. The thickness of the aluminum pattern is relatively exaggerated for emphasis in FIGS. 7 and 8, and this also applies to the figures described below.

FIGS. 9A through 9D are cross-sectional views that illustrate a method of manufacturing a PCB according to embodiments. Redundant descriptions between FIGS. 9A through 9D and FIGS. 3A through 3H and 6A through 6D are omitted below.

Figure 9A:
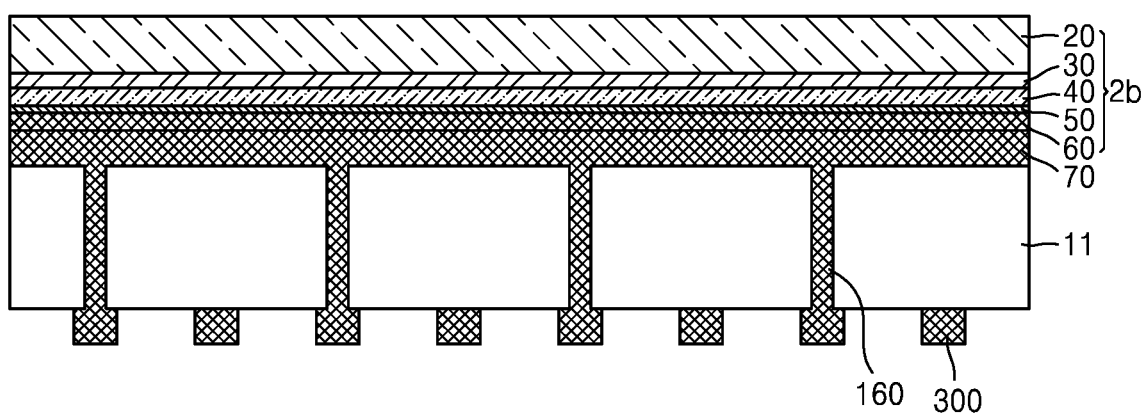

Referring to FIG. 9A, according to an embodiment, the carrier substrate 2b is provided that includes the carrier layer 20, the release layer 30, the aluminum layer 40, the barrier layer 50, and the seed layer 60. The first conductive layer 70 is formed on the seed layer 60. The first insulating layer 11 and the third conductive pattern 300 are formed on the first conductive layer 70. The first contact plug 160 is formed that penetrates into the first insulating layer 11 and electrically connects the first conductive layer 70 and the third conductive pattern 300. The third conductive pattern 300 can be formed by patterning a third conductive layer. The release layer 30, the aluminum layer 40, the barrier layer 50, first conductive layer 70, the first insulating layer 11, and the third conductive pattern 300 are shown as being formed on one surface of the carrier layer 20 in FIG. 9A, but embodiments are not limited thereto. In other embodiments, the release layer 30, the aluminum layer 40, the barrier layer 50, first conductive layer 70, the first insulating layer 11, and the third conductive pattern 300 may be formed on an opposite surface, so that the release layer 30, the aluminum layer 40, the barrier layer 50, first conductive layer 70, the first insulating layer 11, and the third conductive pattern 300 are formed in both surfaces.

Figure 9B:
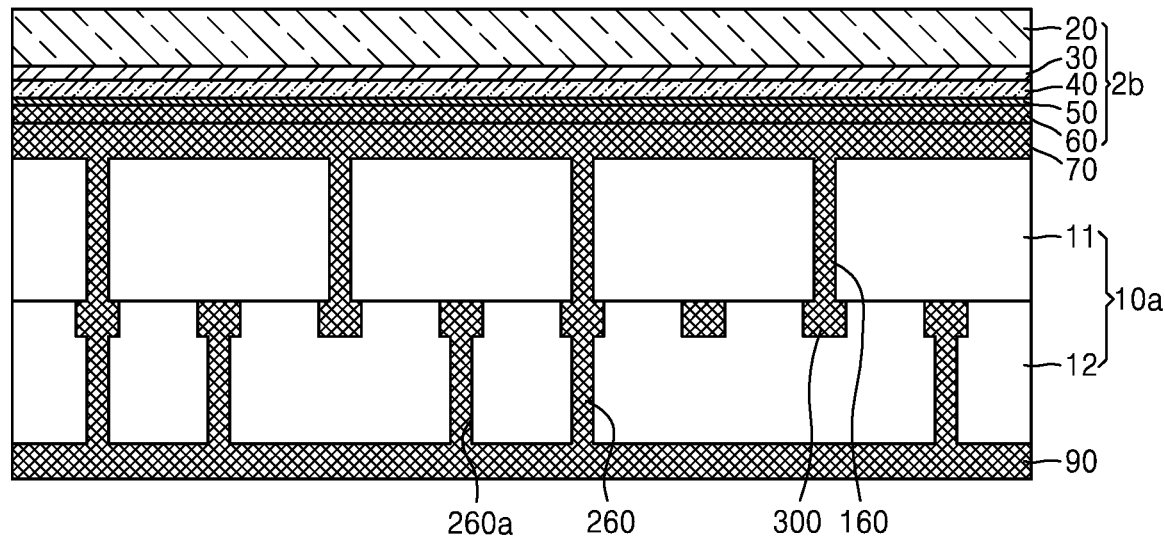

Referring to FIG. 9B, according to an embodiment, the second insulating layer 12 is formed to cover the third conductive pattern 300. The first insulating layer 11 and the second insulating layer 12 include the same material. A material used to form the second insulating layer 12 is described with reference to FIG. 1, above. The second conductive layer 90 is formed on a lower portion of the second insulating layer 12, The first conductive layer 70, the second conductive layer 90, and the third conductive pattern 300 include the same material. For example, the first conductive layer 70, the second conductive layer 90, and the third conductive pattern 300 may include copper. However, embodiments of the first conductive layer 70, the second conductive layer 90, and the third conductive pattern 300 are not limited thereto and may include different materials in other embodiments.

According to an embodiment, the second contact plug 260 is formed that penetrates into the second insulating layer 12 and is connected to the second conductive layer 90. The contact plug 260 can be formed by forming a contact hole 260a using wet or dry etching or through mechanical drilling or laser drilling and then through a plating process.

Figure 9C:
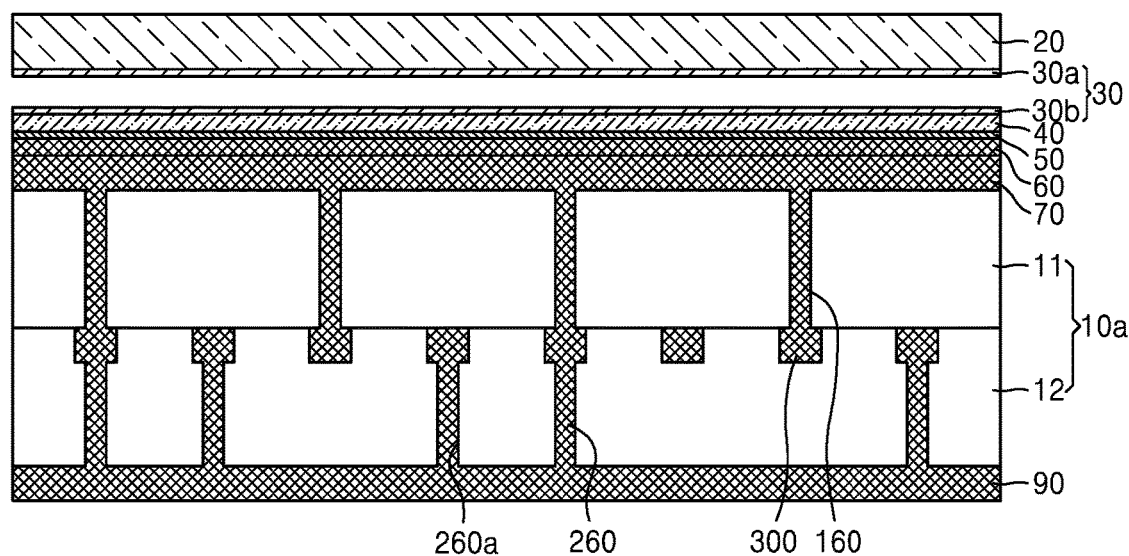

Referring to FIG. 9C, according to an embodiment, the carrier layer 20 and the aluminum layer 40 are separated from each other by separating the release layer 30 into two sublayers. A separation process may be performed by using a physical method, a chemical method, etc. Sublayer 30a of the release layer 30 remains on the carrier layer 20. Sublayer 30b of the release layer 30 remains on the aluminum layer 40. The separated carrier layer 20 and the sublayer 30a of the release layer 30 are removed. The aluminum pattern 110, the barrier pattern 140, the first conductive pattern 100, and the second conductive pattern 200 are respectively formed by patterning the aluminum layer 40, the barrier layer 50, the first conductive layer 70, and the second conductive layer 90. In this regard, the sublayer 30b of the release layer 30 is removed from the aluminum layer 40.

Figure 9D:
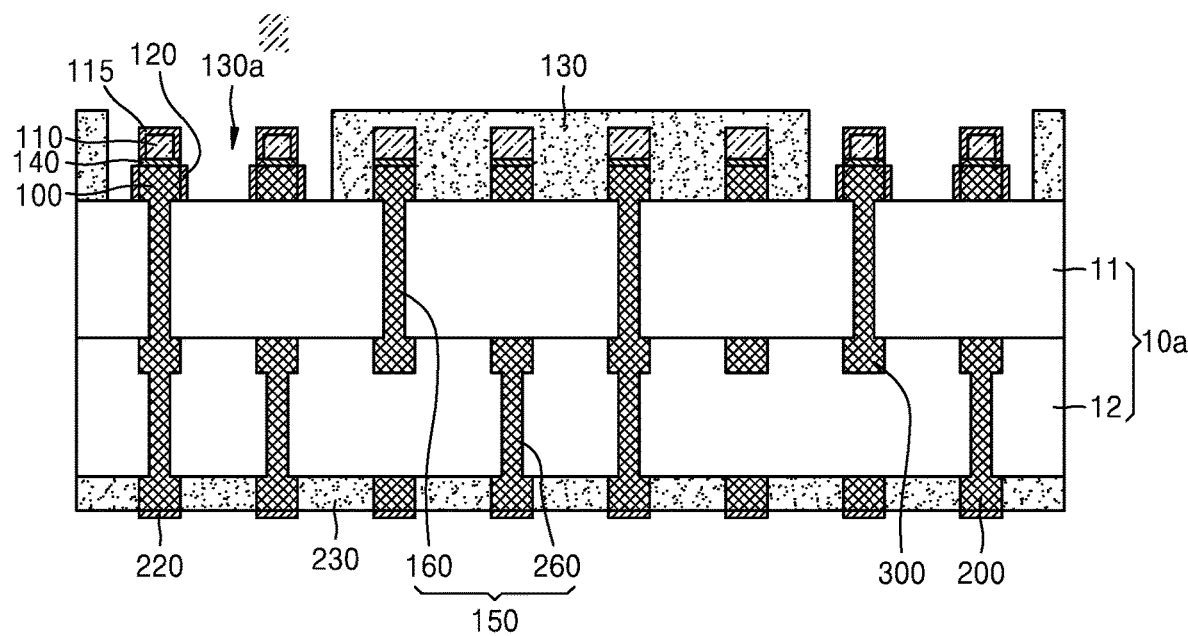

Referring to FIG. 9D, according to an embodiment, the first solder resist layer 130 and the second solder resist layer 230 are respectively formed on an upper surface of the insulating layer 10a and a lower surface of the insulating layer 10a opposite to the upper surface of the insulating layer 10a. The first solder resist layer 130 covers upper surface and sides of the aluminum pattern 110, sides of the barrier pattern 140, and sides of the first conductive pattern 100, The second solder resist layer 230 covers sides of the second conductive pattern 200.

According to an embodiment, the first solder resist layer 130 includes the at least one opening 130a that exposes a part of the first conductive pattern 100, a part of the barrier pattern 140, and a part of the aluminum pattern 110. The exposed parts of the first conductive pattern 100, the part of the barrier pattern 140, and the part of the aluminum pattern 110 can function as pads that contact a bonding wire that electrically connects the PCB and a semiconductor chip or a semiconductor package that is mounted on the PCB.

According to an embodiment, the first passivation layer 120 and the second passivation layer 220 are respectively formed on exposed surfaces of the first conductive pattern 100 and the second conductive pattern 200. Thus, the first passivation layer 120 is formed on sides of portions of the first conductive pattern 100, and the second passivation layer 220 is formed on lower surfaces of at least portions of the second conductive pattern 200. The first passivation layer 120 and the second passivation layer 220 can be formed through an OSP surface treatment. The first passivation layer 120 and the second passivation layer 220 can be simultaneously formed, but embodiments are not limited thereto. The oxide layer 115 is formed on a surface of the aluminum pattern 110 that is exposed by the opening 130a. The oxide layer 115 is an aluminum oxide. The oxide layer 115 can protect the aluminum pattern 110, FIG. 10 is a cross-sectional view of a semiconductor package 1000 in which a PCB 1 is used according to embodiments.

Referring to FIG. 10, according to an embodiment, the semiconductor package 1000 includes the PCB 1, a semiconductor chip 500, and a mold layer 700. An adhesive layer 550 is formed on the PCB 1. The semiconductor chip 500 can be attached to the adhesive layer 550. The PCB 1 may be the PCB 1a, 1b, 1c, or 1d of FIGS. 1, 2, 4, 5, 7, and 8.

In some embodiments, the semiconductor chip 500 may be a controller chip, a non-volatile memory chip, a volatile memory chip, and/or a dummy chip, or a combination of these chips.

A non-volatile memory chip may be, for example, a NAND flash memory, a resistive random access memory (RRAM), a magnetoresistive RAM (MRAM), a phase-changed RAM (PRAM), or a ferroelectric RAM (FRAM). A non-volatile memory chip may be a semiconductor package that includes one non-volatile memory chip or a plurality of stacked non-volatile memory chips.

In some embodiments, a plurality of semiconductor chips 500 may be stacked in the PCB 1. In some embodiments, the plurality of stacked semiconductor chips 500 may be electrically connected to each other via a through electrode.

According to an embodiment, a bonding wire 600 electrically connects the PCB 1 and the semiconductor chip 500. The bonding wire 600 may include, for example, copper or gold. The bonding wire 600 penetrates into the oxide 115 formed on a surface of the aluminum pattern 110 to electrically connect a pad 520 of the semiconductor chip 500 and the first conductive pattern 100 of the PCB 1.

According to an embodiment, the mold layer 700 is formed on an upper surface of the PCB 1 to cover at least a part of the upper surface of the PCB 1 and the semiconductor chip 500. The mold layer 700 may include, for example, a silicon material, a thermosetting material, a thermoplastic material, a UV curable material, etc. When the mold layer 700 includes a thermosetting material, the mold layer 700 may include a phenol type agent, an acid anhydride type agent, an amine type curable agent, or an acrylic polymer additive.

In some embodiments, the mold layer 700 includes resin while including a relatively small amount of filler. In this regard, the filler may be a silica filler.

Although the semiconductor chip 500 is mounted in FIG. 10, another semiconductor package may be mounted on the PCB 1 to form a package-on-package (POP) structure.

While embodiments of the inventive concept has been particularly shown and described with reference to exemplary embodiments thereof, it will be understood that various changes in form and details may be made therein without departing from the spirit and scope of the following claims.

What is claimed is:

1. A printed circuit board (PCB), comprising:
   an insulating layer that includes an upper surface and a lower surface opposite to the upper surface;
   a first conductive pattern on the upper surface of the insulating layer;
   a second conductive pattern on the lower surface of the insulating layer;
   a first solder resist layer with an opening on the insulating layer;
   an aluminum pattern that covers an upper surface of the first conductive pattern;
   a second passivation layer is disposed on and directly contacts a portion of a first surface of the second conductive pattern opposite at second surface of the second conductive pattern, wherein the second surface of the second conductive pattern directly contacts the lower surface of the insulating layer; and
   first passivation layers that cover a side surface of part of the first conductive pattern exposed by the opening of the first solder resist layer,
   wherein spaces are formed between each of the first passivation layers.

2. The PCB of claim 1, wherein the upper surface of the first conductive pattern is higher than the upper surface of the insulating layer.

3. The PCB of claim 1, wherein the first passivation layers comprises a material formed through an organic solderability preservative (OSP) surface treatment.

4. The PCB of claim 1, further comprising a second solder resist layer on the lower surface of the insulating layer,
   wherein the second solder resist layer covers sides of the second conductive pattern.

5. The PCB of claim 1, further comprising:
   a barrier pattern between the first conductive pattern and the aluminum pattern.

* * * * *